US007019589B1

(12) United States Patent
Wiles, Jr. et al.

(10) Patent No.: US 7,019,589 B1
(45) Date of Patent: Mar. 28, 2006

(54) TRANSIMPEDANCE AMPLIFIER

(75) Inventors: William W. Wiles, Jr., Melbourne, FL (US); Cecil Aswell, Orangevale, CA (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 92 days.

(21) Appl. No.: 10/823,613

(22) Filed: Apr. 14, 2004

Related U.S. Application Data

(60) Provisional application No. 60/463,041, filed on Apr. 16, 2003.

(51) Int. Cl.
*H03F 1/36* (2006.01)
(52) U.S. Cl. .......................................... 330/86; 330/308
(58) Field of Classification Search ................ 330/308, 330/86, 85; 250/214 AG
See application file for complete search history.

(56) References Cited

U.S. PATENT DOCUMENTS

| | | | |
|---|---|---|---|
| 5,786,730 A * | 7/1998 | Hadley | 330/59 |
| 5,994,966 A | 11/1999 | Stikvoort | |
| 6,593,810 B1 * | 7/2003 | Yoon | 330/69 |
| 6,703,682 B1 | 3/2004 | Aswell | |

FOREIGN PATENT DOCUMENTS

WO  WO 01/47117 A1  6/2001

\* cited by examiner

*Primary Examiner*—Robert Pascal
*Assistant Examiner*—Hieu Nguyen
(74) *Attorney, Agent, or Firm*—Locke Liddell & Sapp LLP

(57) ABSTRACT

A transimpedance amplifier includes a first amplifier, a first MOS resistor device and a first voltage divider circuit. The source terminal of the first MOS resistor device is coupled to the first amplifier inverting input. The voltage divider circuit is coupled between the first amplifier output and the non-inverting input. The output of the first voltage divider is coupled to the first MOS resistor drain terminal. A second amplifier, second MOS resistor device and a second voltage divider circuit is also provided. The output of the second amplifier is coupled to the gate terminal of the first MOS resistor device. The gate terminal of the second MOS resistor device is coupled to the second amplifier output. The drain terminal of the second MOS resistor device is coupled to the second amplifier non-inverting input. The second voltage divider circuit is coupled between the first amplifier output and the second MOS resistor device source terminal, and has an output coupled to the second amplifier inverting input.

4 Claims, 2 Drawing Sheets

TRANSIMPEDANCE AMPLIFIER

RELATED APPLICATION

This application claims the benefit of U.S. Provisional Patent Application Ser. No. 60/463,041 filed Apr. 16, 2003, and entitled "Transimpedance Amplifier".

TECHNICAL FILED OF THE INVENTION

The present invention relates to transimpedance amplifiers, and more particularly to a transimpedance amplifier having improved linear operating characteristics.

BACKGROUND OF THE INVENTION

There are many systems applications where an accurate conversion of an input current to a voltage output is required. This process is called Transimpedance Amplification (TA). In addition, the source of signal current may be a sensor element (such as, for example, a photodiode) in which the voltage across the photodiode must be held to a value as close to 0 volts as possible to minimize error producing leakage currents. The use of an operational amplifier (OA) to hold the voltage across the sensor element at 0 Volts (0V) with a feedback resistor converts the signal current to a voltage.

As is true with most sensor interface problems, the requirement exists to maximize the Signal-to-Noise (SIN) ratio due to the need to detect smaller and smaller signal currents. This drive toward higher sensitivity implies the need to implement increasingly larger values of the feedback resistor. In tandem, there is always the desire to maximize the accuracy of the sensor as well as to increase its bandwidth. This desire results in the need for the feedback resistor to be as linear as possible over its operating voltage and temperature range and for its implementation to minimize any parasitic elements. Finally, the requirement to package this high sensitivity TA in as small a volume as possible due to the physical placement of the sensor into tight locations exists. This miniaturization requirement leads to the need to implement a self contained TA in integrated circuit form.

In an integrated circuit TA the physical size of the resistance element presents a problem. If implemented with available on-chip resistors, this resistor will become physically quite large to the point of increasing cost to an unfeasible level for all but the lowest sensitivity applications. In response to this problem a metal-oxide-semiconductor (MOS) transistor as a resistor based on the knowledge that a MOS device is effectively a voltage controlled resistor when operated in its triode region has been used in TA circuits.

MOS parameters include surface mobility ($\mu$), gate capacitance (Cox), width (W) and length (L). The combination of MOS parameters sets the maximum resistance the device can exhibit and the externally generated control signal (Vg) is then used to modulate the resistance to a lower value as required. This modulation can be used to counteract temperature effects and MOS device non-linearity.

A non-linearity that must be dealt with in a TA implementation using a MOS device is saturation. The drain saturation voltage (Vdsat) limits the usable range of output voltage for a particular value of Vgs. This problem can be a significant problem in low voltage circuits, and can be addressed using a voltage divider circuit to scale the drain voltage (Vds) of the MOS device to a value that is within its linear range.

An additional non-linearity to be overcome centers on the Vds vs Ids characteristic of the MOS device while the device is operating within its triode region. If the TA is to be operated under constant Vgs conditions, the value of Vgs will have to be very large when compared to the device's Vds. Assuming constant Vgs operation, this operation also means that the W/L of the device will have to be reduced as the value of Vgs is increased such that the product of (Vgs−Vto)×(W/L) remains constant. This geometric ratio increase will increase the MOS device's gate area which will decrease its bandwidth capability. The trade here is to increase the voltage divider ratio, but this will significantly increase the offset error term in most cases.

Taking all of the above trade factors into consideration, the concept of implementing an integrated circuit TA using an MOS device under constant Vgs bias as the resistance element is considered to be impractical in many cases except those in where accuracy is not a primary requirement. To solve this problem, the use of a variable gate bias as a function of the input signal current has been developed. The gate bias is derived and is modulated by the output voltage of the TA. However, a need still exists for a TA with highly linear operation.

SUMMARY OF THE INVENTION

In accordance with the present invention, a transimpedance amplifier is provided. The transimpedance amplifier includes a first amplifier, a first MOS resistor device and a first voltage divider circuit. The source terminal of the first MOS resistor device is coupled to the first amplifier inverting input. The voltage divider circuit is coupled between the first amplifier output and the non-inverting input. The output of the first voltage divider is coupled to the first MOS resistor drain terminal. A second amplifier, second MOS resistor device and a second voltage divider circuit is also provided. The output of the second amplifier is coupled to the gate terminal of the first MOS resistor device. The gate terminal of the second MOS resistor device is coupled to the second amplifier output. The drain terminal of the second MOS resistor device is coupled to the second amplifier non-inverting input. The second voltage divider circuit is coupled between the first amplifier output and the second MOS resistor device source terminal, and has an output coupled to the second amplifier inverting input.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENT

Figure 1:
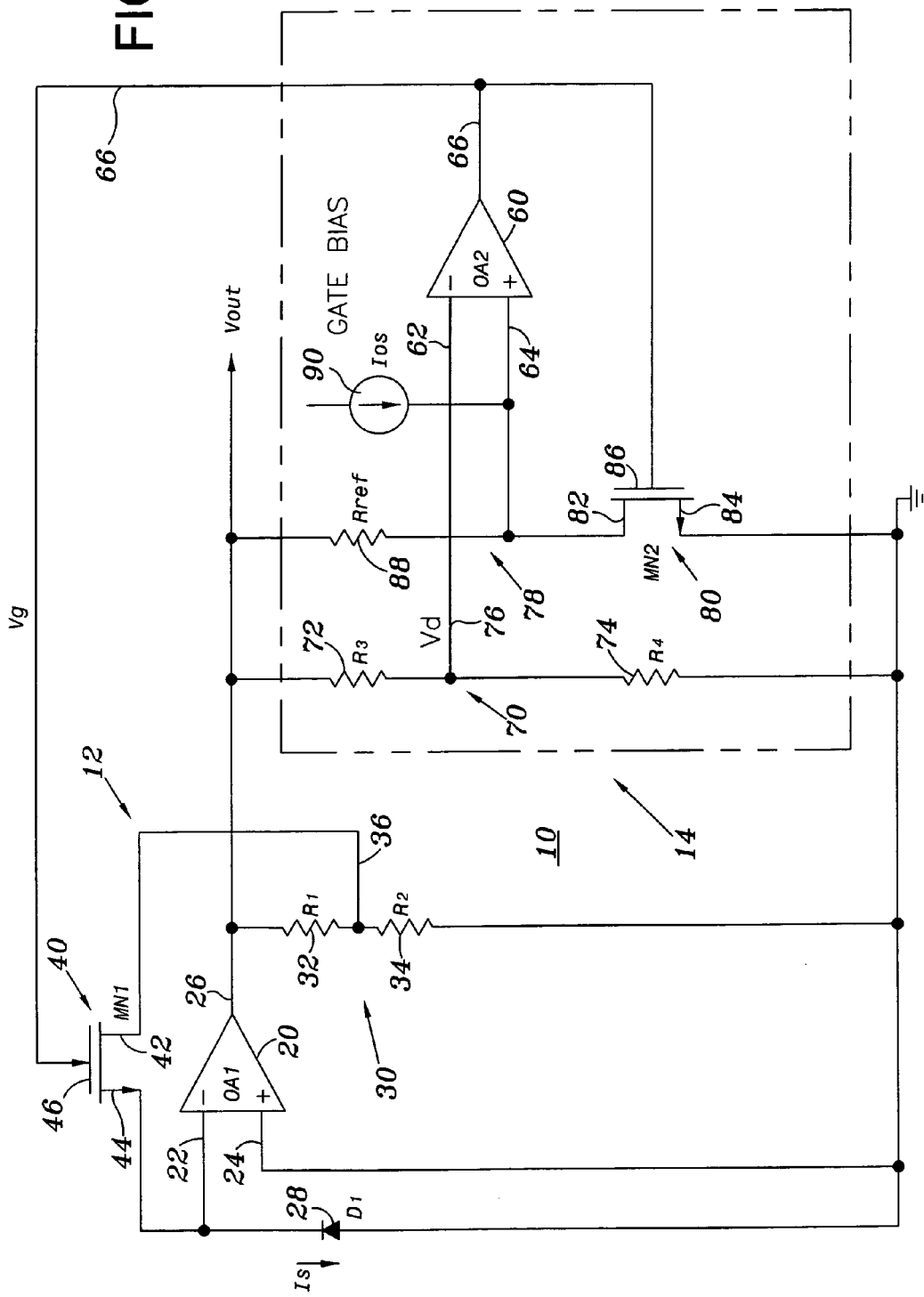
FIG. 1 is a schematic diagram of the present transimpedance amplifier.

Referring to FIG. 1, the present transimpedance amplifier is illustrated, and is generally identified by the numeral 10. Transimpedance amplifier circuit 10 utilizes an operational amplifier circuit, generally identified by the numeral 12 and a gate bias circuit, generally identified by the numeral 14.

Operational amplifier circuit 12 includes a first amplifier 20 (OA1) having an inverting input 22, a non-inverting input 24 and an output 26. A source of signal current is provided by a sensor element, such as for example, photodiode 28 (D1) which generates current $I_s$.

Coupled to output 26 of first amplifier 20 is a first voltage divider circuit, generally identified by the numeral 30. First voltage divider circuit 30 includes a resistor 32 (R1) and a resistor 34 (R2) and has an output 36.

A first MOS resistor device, generally identified by the numeral 40 (MN1) is coupled between the output 36 of first voltage divider circuit 30 and the inverting input 22 of first amplifier 20. First MOS resistor device 40 includes a drain terminal 42, source terminal 44 and gate terminal 46. The gate bias $V_g$ is modulated by the output voltage of first amplifier 20 utilizing gate bias circuit 14.

Gate bias circuit 14 includes a second amplifier 60 (OA2) having an inverting input 62, a non-inverting input 64 and an output 66. Output 66 of second amplifier 60 is coupled to gate 46 of first MOS resistor device 40.

Coupled to the output 26 of first amplifier 20 is a second voltage divider circuit, generally identified by the numeral 70. Second voltage divider circuit 70 includes a resistor 72 (R3) and resistor 74 (R4). The output 76 of second voltage divider circuit 70, Vd, is coupled to the inverting input 62 of second amplifier 60.

Also coupled to the output 26 of first amplifier 20 is a third voltage divider circuit, generally identified by the numeral 78. Third divider circuit 78 includes a second MOS resistor device (MN2), generally identified by the numeral 80. Second MOS resistor device 80 includes a drain terminal 82, source terminal 84 and a gate terminal 86. Coupled to the drain terminal 82 of second MOS resistor device 80 is a resistor 88 ($R_{ref}$). The output of second amplifier 60 is applied to the gate terminal 86 of second MOS resistor device 80. The output of third voltage divider circuit 78 is applied to the non-inverting input 64 of second amplifier 60. A current source ($I_{os}$) 90 is also applied to the non-inverting input 64 of second amplifier 60.

The operation of TA 10 is as follows. Assume that a DC signal current is flowing and that a differential signal current (dIs) is generated that produces an output voltage (dVout) according to:

$$dVout = dIs \times Rmn1 \times (1+R1/R2) \quad (1)$$

where the MOS 40 resistance (Rmn1) is defined by:

$$1/Rmn1 = (W1/L1) \times \mu \times Cox \times (Vgs-Vto) \quad (2)$$

where L1 and W1 are the length and width of MN1, µ is the surface mobility and Cox is the gate capacitance of MN1.

The differential Vds of MOS device MN1 is:

$$Vdsmn1 = Vout \times (R2/(R1+R2)) \quad (3)$$

dVout is also applied to the R3–R4 voltage divider 70 in the gate bias circuit 14 resulting in:

$$dVd\ dVd = dVout \times (R4/(R3+R4)). \quad (4)$$

The drain 82 of MN2 80 is held at dVd by OA2 60 which results in a differential current flowing through Rref of:

$$dIref = (dVout/Rret) \times (R3/(R3+R4)) \quad (5)$$

and the resulting resistance of MN2 80 is derived to be:

$$Rmn2 = Rref \times (R4/R3). \quad (6)$$

Rmn2 is constant and totally independent of the input voltage (both DC and small signal) and the output of OA2 60 therefore describes the non-linear Vgs voltage required to maintain this resistance level over the total range of Vout. Using this value of resistance, the equation describing Vgs for a particular DC value of Vout can thus be derived to be:

$$Vgs = Vto + (1/Rref) \times (R3/R4) \times (L2/W2) \times (1/\mu Cox) \quad (7)$$

where L2 and W2 are the length and width of MN2, µ is the surface mobility and Cox is the gate capacitance of MN2 80. Substituting this value of Vgs into the Equation (2) for Rmn1 yields:

$$Rmn1 = Rref \times (W2/W1) \times (L1/L2) \times (R4/R3), \quad (8)$$

which when substituted back into the Equation (1) describing dVout in terms of Rmn1 yields:

$$dVout = dIs \times Rref \times (W2/W1) \times (L1/L2) \times (R4/R3) \times (1+R1/R2). \quad (9)$$

Equation (9) is correct if devices 40 and 80 are operated at identical values of Vds. For this operation to be true the R1/R2 and R3/R4 ratios must be identical. Setting these ratios to the value K reduces the Equation (9) to:

$$dVout = dIs \times Rref \times (W2/W1) \times (L1/L2) \times (1+1/K). \quad (10)$$

Equation (10) becomes the governing equation for this configuration which is completely void of any non-linear device parameters. Equation (10) also shows that device scaling applies and that the value of Rref can be reduced by adjusting the MN1 to MN2 geometric ratios.

Under the condition of zero DC signal current, Vout is zero and all of the drain voltages are 0 which results in a null set of describing equations and a potentially unstable condition. To alleviate this issue, a small current 90 (Ios) is continuously applied to the drain 82 of MN2 which forces the Vgs output to the voltage required to sink this current and thus ensures continuous operation.

Figure 2:
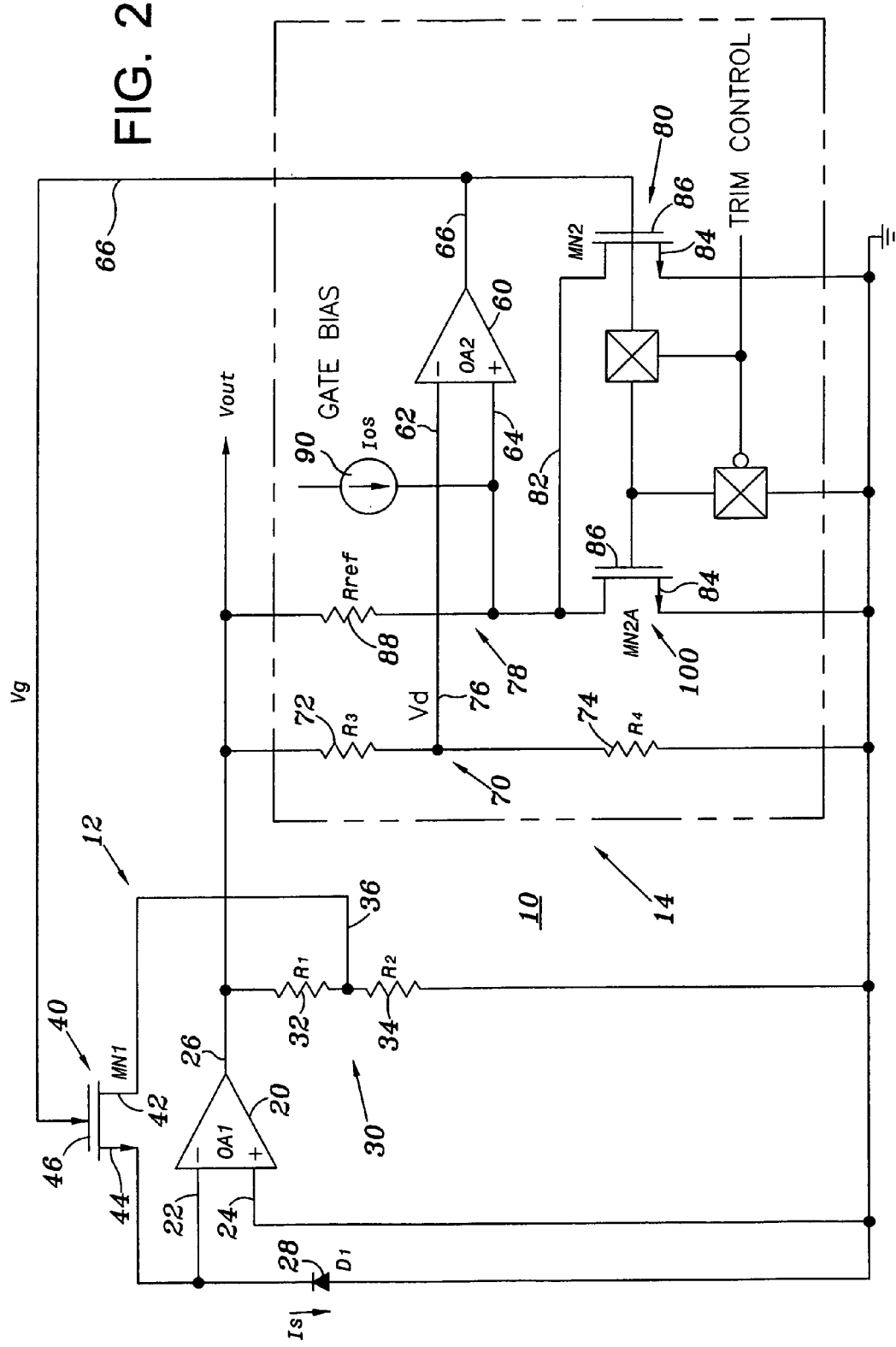
FIG. 2 is a schematic diagram of an alternate embodiment of the present transimpedance amplifier.

The transimpedance of the TA 10 is set by resistor Rref 88 and for a totally integrated circuit this resistor must be provided from those available in the process. Rref will therefore have a very large initial tolerance which most likely exceeds the circuit performance requirements. To alleviate this issue a trim procedure is instituted as illustrated in FIG. 2. Inspection of the Vout Equation (10) shows that the geometric ratios between MN1 and MN2 are direct multipliers to the transimpedance. These ratios can therefore be altered to accommodate the Rref tolerance in a manner that keeps the product of Rref and one of the geometric ratios constant. The addition of one or more additional MOS resistor devices 100 in parallel with MOS 80 accomplishes this function.

Other alteration and modification of the invention will likewise become apparent to those of ordinary skill in the art upon reading the present disclosure, and it is intended that the scope of the invention disclosed herein be limited only by the broadest interpretation of the appended claims to which the inventor is legally entitled.

The invention claimed is:

1. A transimpedance amplifier comprising:
    a first amplifier having an inverting input, a non-inverting input and an output;
    a first MOS resistor device having a drain terminal, a source terminal and a gate terminal, said source terminal begin coupled to said first amplifier inverting input;
    a first voltage divider circuit coupled between said first amplifier output and said first amplifier non-inverting input and having an output coupled to said first MOS resistor device drain terminal;

a second amplifier having an inverting input, a non-inverting input and an output, said output being coupled to said gate terminal of said first MOS resistor device;

a second MOS resistor device having a drain terminal, a source terminal and a gate terminal, said gate terminal coupled to said second amplified output, and said drain terminal coupled to said second amplifier non-inverting input;

a second voltage divider circuit coupled between said first amplifier output and said second MOS resistor device source terminal, and having an output coupled to said second amplifier inverting input; and a resistor coupled between said first amplifier output and said second MOS resistor device drain terminal.

2. The transimpedance amplifier of claim 1 and further including a photodiode coupled between said first amplifier non-inverting input and said inverting input.

3. The transimpedance amplifier of claim 1 and further including a current source coupled to said second amplifier non-inverting input.

4. The transimpedance amplifier of claim 1 and further including a third MOS resistor device coupled in parallel with said second MOS resistor device.

* * * * *